(12) United States Patent
Kayamoto et al.

(10) Patent No.: US 9,556,524 B2
(45) Date of Patent: Jan. 31, 2017

(54) TEMPERATURE REGULATOR, COOLING DEVICE, AND METHOD FOR MANUFACTURING TEMPERATURE REGULATOR

(75) Inventors: Takashi Kayamoto, Isehara (JP); Gou Takahara, Isehara (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 184 days.

(21) Appl. No.: 13/696,156

(22) PCT Filed: Apr. 19, 2011

(86) PCT No.: PCT/JP2011/059661
§ 371 (c)(1),
(2), (4) Date: Nov. 5, 2012

(87) PCT Pub. No.: WO2011/138899
PCT Pub. Date: Nov. 10, 2011

(65) Prior Publication Data
US 2013/0056187 A1 Mar. 7, 2013

(30) Foreign Application Priority Data
May 7, 2010 (JP) .................................. 2010-107710

(51) Int. Cl.
*F28F 3/12* (2006.01)
*B23P 15/26* (2006.01)
(Continued)

(52) U.S. Cl.
CPC ............ *C23C 24/04* (2013.01); *F28D 1/0478* (2013.01); *F28F 1/04* (2013.01); *F28F 7/02* (2013.01);
(Continued)

(58) Field of Classification Search
CPC .................. F28F 2013/0056; F28F 2013/006; F28F 2013/005; F28F 1/12; F28F 3/12; F28D 1/0477; F28D 1/0472; B05D 1/12; B23P 15/26
(Continued)

(56) References Cited

U.S. PATENT DOCUMENTS 490,506 A * 1/1893 Seitz .......................... F28F 3/12
165/170
3,983,934 A * 10/1976 Lee .......................... F28F 3/12
165/165
(Continued)

FOREIGN PATENT DOCUMENTS

EP 542534 A1 * 5/1993
JP 62-044567 A 2/1987
(Continued)

OTHER PUBLICATIONS

Office Action dated Feb. 20, 2014, issued for the Korean patent application No. 10-2012-7028979.
(Continued)

*Primary Examiner* — Ryan J Walters
*Assistant Examiner* — Erik Mendoza-Wilkenfe
(74) *Attorney, Agent, or Firm* — Locke Lord LLP

(57) ABSTRACT

A temperature regulator or the like that can circulate a desired thermal medium and efficiently transfer the heat of the thermal medium is provided. The temperature regulator includes a pipe that is made of a metal or alloy with corrosion resistance to a predetermined thermal medium and that serves as a flow path for circulating the thermal medium; and a plate in which the pipe is buried, wherein the plate is formed by accelerating powder made of aluminum (Al) or alloy together with a gas and thereafter spraying the
(Continued)

powder remaining in a solid phase toward the pipe so that the powder is deposited on the pipe.

5 Claims, 6 Drawing Sheets

(51) Int. Cl.
| | | |
|---|---|---|
| *B05D 1/12* | (2006.01) | |
| *C23C 24/04* | (2006.01) | |
| *F28D 1/047* | (2006.01) | |
| *F28F 1/04* | (2006.01) | |
| *F28F 7/02* | (2006.01) | |
| *F28F 21/08* | (2006.01) | |
| *H01L 21/67* | (2006.01) | |

(52) U.S. Cl.
CPC ......... *F28F 21/08* (2013.01); *H01L 21/67109* (2013.01); *F28F 2275/02* (2013.01)

(58) Field of Classification Search
USPC ....... 165/133, 134.1, 168, 905, 907; 164/19, 164/20, 46
See application file for complete search history.

(56) References Cited

U.S. PATENT DOCUMENTS

| | | | |
|---|---|---|---|
| 5,509,472 A * | 4/1996 | Tamura | F28F 13/00 165/168 |
| 6,937,045 B2 | 8/2005 | Sinclair | |
| 2004/0011495 A1 | 1/2004 | Fischers et al. | |
| 2006/0011149 A1* | 1/2006 | Stevens | F24H 1/18 122/19.2 |
| 2006/0243412 A1 | 11/2006 | Fischer et al. | |
| 2009/0013933 A1 | 1/2009 | Lim et al. | |
| 2009/0139706 A1* | 6/2009 | Aoki | 165/185 |
| 2010/0170937 A1* | 7/2010 | Calla | C23C 24/04 228/165 |
| 2010/0251962 A1* | 10/2010 | Fukanuma | 118/302 |

FOREIGN PATENT DOCUMENTS

| | | |
|---|---|---|
| JP | 10-163307 A | 6/1998 |
| JP | 2003-275859 A | 9/2003 |
| JP | 2004-510599 A | 4/2004 |
| JP | 2008-300455 A | 12/2008 |
| JP | 2009-013497 A | 1/2009 |

OTHER PUBLICATIONS

Kazuhiko Sakaki, "Overview of cold spray technology and cold sprayed light metals coatings," Journal of Japan Institute of Light Metals, vol. 56, No. 7, The Japan Institute of Light Metals, Jul. 2006, pp. 376-385.

International Search Report dated Jul. 12, 2011, issued for PCT/JP2011/059661.

Office Action issued in corresponding Taiwanese Patent Application No. TW 101125984, dated Nov. 17, 2014.

* cited by examiner (a)

(b)

(c)

TEMPERATURE REGULATOR, COOLING DEVICE, AND METHOD FOR MANUFACTURING TEMPERATURE REGULATOR

FIELD

The present invention relates to a temperature regulator that regulates temperature of a substrate, etc. in a process for manufacturing a semiconductor, a liquid crystal display device, an optical disk, etc., and in particular, to a cooling device that cools a substrate, etc.

BACKGROUND

Conventionally, in various processes performed on a substrate for manufacturing a semiconductor, a liquid crystal display device, an optical disk, or the like, a temperature regulator (a cooling device or a heating device) is used, in which a flow path for circulating a thermal medium for cooling or heating is formed inside a plate made of aluminum or aluminum alloy. Such a temperature regulator is formed such that, for example, two bulk materials to be used as an upper side and a lower side of the plate are prepared, the flow path is formed on each of the surfaces by a groove cutting process, and the surfaces of the upper side and the lower side of the plate where the flow paths are formed are brought into contact with each other and joined by brazing or the like. Because aluminum has good thermal conductivity, there is an advantage in that heat of the thermal medium can efficiently be transferred to the substrate via the wall of the flow path and the plate, and the temperature of the substrate can be regulated quickly and uniformly.

Meanwhile, because aluminum is a highly corrosive metal, a thermal medium that is available to the temperature regulator made of aluminum is limited. Therefore, water mixed with corrosion inhibitor (process cooling water: PCW), organic solvent, inert gas, or the like is exclusively used. However, in the industry, there is a demand to use, as the thermal medium, city water that can easily be available at low costs or seawater that can abundantly be available from natural resources.

To make the flow path resistant to corrosion, it may be possible to form a flow path portion with a corrosive metal or alloy. For example, Patent Literature 1 discloses a technology in which a cooling pipe made of copper having excellent thermal conductivity and corrosion resistance is installed inside the main body of a susceptor of a semiconductor manufacturing apparatus.

CITATION LIST

Patent Literature

Patent Literature 1: Japanese Patent Application Laid-open No. 2009-13497

SUMMARY

Technical Problem

If a pipe for circulating the thermal medium and a heat-transfer plate for placing a substrate are made of dissimilar metals, it is extremely difficult to join the pipe and the plate without a gap. Therefore, in this case, the contact thermal resistance between the pipe and the plate is increased, so that the cooling efficiency (or the heating efficiency) or the soaking performance of the temperature regulator is reduced.

The present invention has been made in view of the above, and an object thereof is to provide a temperature regulator capable of circulating a desired thermal medium and efficiently transferring the heat of the thermal medium, and to provide a cooling device and a method for manufacturing the temperature regulator.

Solution to Problem

To solve the problem described above and achieve the object, a temperature regulator according to the present invention includes: a pipe that is made of a metal or alloy with corrosion resistance to a predetermined thermal medium and serves as a flow path for circulating the thermal medium; and a plate in which the pipe is buried, the plate being formed by accelerating powder made of aluminum (Al) or aluminum alloy together with a gas and thereafter spraying the powder remaining in a solid phase toward the pipe so that the powder is deposited on the pipe.

In the temperature regulator according to the present invention as set forth in the invention described above, the plate is formed by using a cold spray technique.

In the temperature regulator according to the present invention as set forth in the invention described above, the plate includes a base plate that is arranged adjacent to the pipe and that is made of aluminum or aluminum alloy.

In the temperature regulator according to the present invention as set forth in the invention described above, the plate has a substrate holding surface for placing a substrate to be subjected to temperature regulation.

In the temperature regulator according to the present invention as set forth in the invention described above, the pipe is made of any of copper (Cu), copper-based alloy, stainless steel, nickel (Ni), nickel-based alloy, tantalum (Ta), tantalum-based alloy, niobium (Nb), niobium-based alloy, titanium, titanium-based alloy, and copper-nickel alloy.

A cooling device according to the present invention includes: the temperature regulator according to the invention described above; an introduction duct for introducing cooling water into the pipe; and a discharge duct for discharging the cooling water from the pipe.

A method for manufacturing the temperature regulator according to the present invention includes: a pipe forming step including forming a pipe with a metal or alloy with corrosion resistance, the pipe being used for circulating a thermal medium; and a plate forming step including accelerating powder made of aluminum (Al) or aluminum alloy together with a gas and spraying the powder remaining in a solid phase toward the pipe so that the powder is deposited on the pipe, thereby forming a plate in which the pipe is buried.

In the method for manufacturing the temperature regulator according to the present invention as set forth in the invention described above, in the plate forming step, the pipe is placed on a base plate made of aluminum or aluminum alloy, and the powder is sprayed onto the base plate.

In the method for manufacturing the temperature regulator according to the present invention as set forth in the invention described above, the plate forming step is performed by using a cold spray technique.

In the method for manufacturing the temperature regulator according to the present invention as set forth in the invention described above, the method further includes a substrate holding surface forming step including polishing a surface of the plate, thereby forming a substrate holding surface for placing a substrate to be subjected to temperature regulation.

In the method for manufacturing the temperature regulator according to the present invention as set forth in the invention described above, in the pipe forming step, the pipe is formed with any of copper (Cu), copper-based alloy, stainless steel, nickel (Ni), nickel-based alloy, tantalum (Ta), tantalum-based alloy, niobium (Nb), niobium-based alloy, titanium, titanium-based alloy, and copper-nickel alloy.

Advantageous Effects of Invention

According to the present invention, a pipe is formed with a metal or alloy with corrosion resistance to a predetermined thermal medium, and a plate is formed by spraying aluminum-based metal powder toward the pipe. Therefore, it is possible to circulate the thermal medium and tightly join the pipe and the plate made of dissimilar metals. As a result, it becomes possible to prevent reduction in the thermal conductivity at the interface between the pipe and the plate and efficiently transfer the heat of the thermal medium flowing through the pipe.

DESCRIPTION OF EMBODIMENTS

Exemplary embodiments of a temperature regulator, a cooling device, and a method for manufacturing the temperature regulator according to the present invention will be explained in detail below with reference to the drawings. The present invention is not limited by the embodiments below.

(First Embodiment)

Figure 1A:
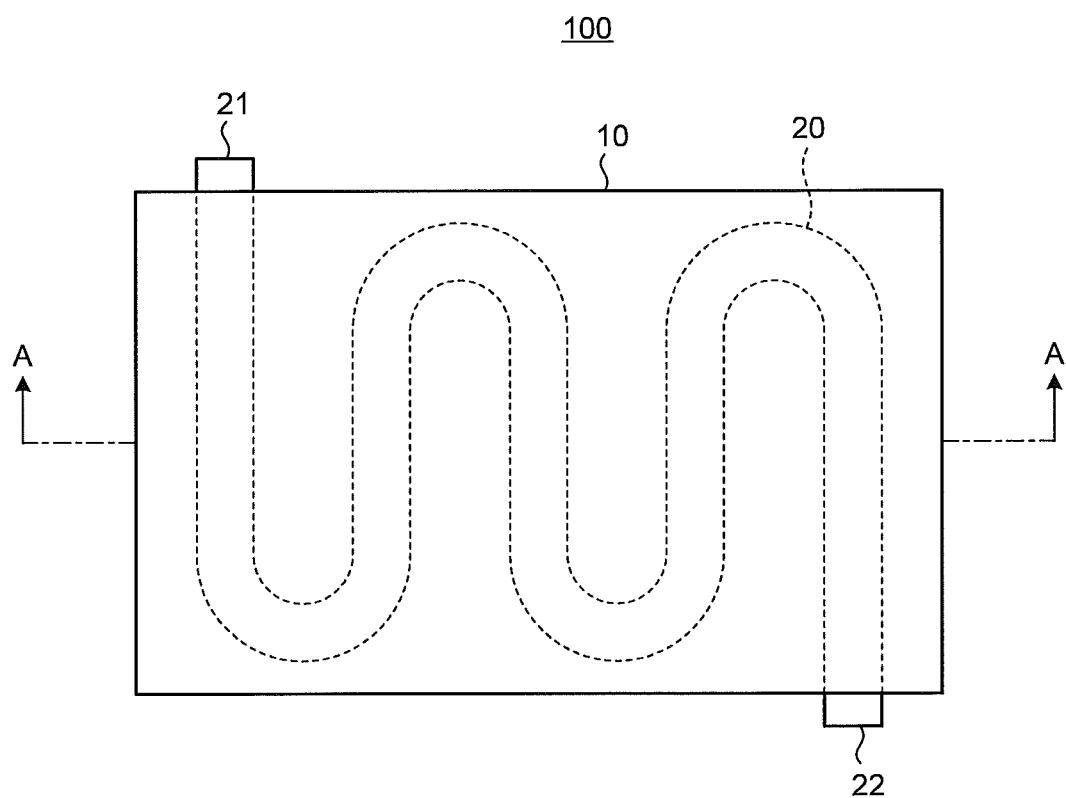
FIG. 1A is a top view illustrating a structure of a temperature regulator according to an embodiment of the present invention.
Figure 1B:
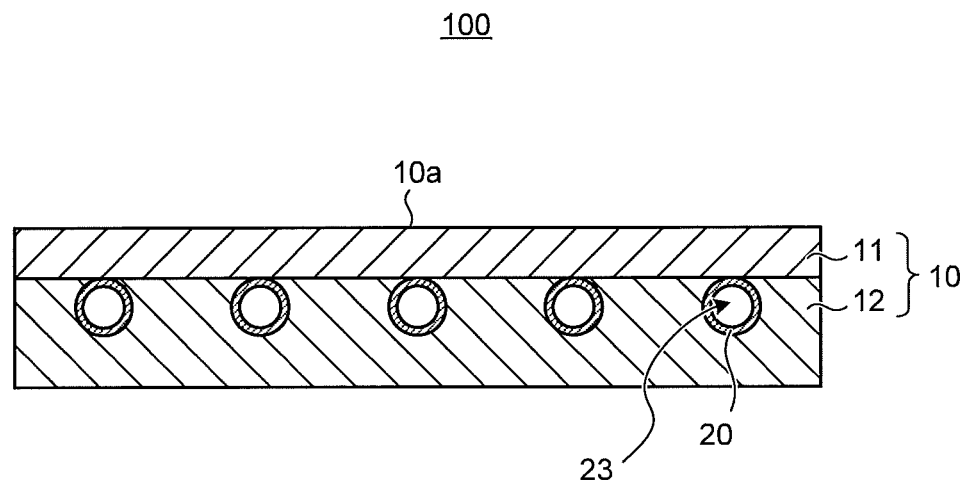
FIG. 1B is a cross-sectional view taken along line A-A in FIG. 1A.

FIG. 1A is a top view illustrating a structure of a temperature regulator according to a first embodiment of the present invention. FIG. 1B is a cross-sectional view taken along line A-A in FIG. 1A.

A temperature regulator 100 includes a plate 10 made of aluminum or aluminum alloy (hereinafter, also referred to as an aluminum-based metal) and a pipe 20 buried in the plate 10.

The plate 10 includes a base plate 11 that is a bulk material made of an aluminum-based metal and that is arranged adjacent to the pipe 20, and includes a deposition portion 12 formed around the pipe 20. The principal surface of the base plate 11 is a substrate holding surface 10a for placing a substrate or the like to be subjected to temperature regulation. Meanwhile, the deposition portion 12 is formed by what is called a cold spray technique, in which aluminum-based metal powder is sprayed and deposited on the base plate 11 and the pipe 20. The formation method and the characteristics of the deposition portion 12 will be explained later. The size and the shape of the plate 10 are not specifically limited, and may be determined according to a substrate to be subjected to temperature regulation.

The pipe 20 includes an inlet port 21 for introducing a thermal medium for cooling or heating and an outlet port 22 for discharging the thermal medium, and serves as a flow path 23 for circulating the thermal medium. The pipe 20 has a shape that is two-dimensionally extended over almost the whole of the plate 10 and is buried in the plate 10 except for the inlet port 21 and the outlet port 22.

The pipe 20 is made of a metal or alloy with corrosion resistance to a thermal medium to be used. For example, if city water is used as the thermal medium, the pipe 20 may be made of a material such as copper (Cu), copper-based alloy, stainless steel (SUS), nickel (Ni), nickel-based alloy (for example, INCONEL which is a product of Special Metals Cooperation), tantalum (Ta), tantalum-based alloy, niobium (Nb), niobium-based alloy, titanium, or titanium-based alloy. If seawater is used as the thermal medium, tantalum, tantalum-based alloy, titanium, titanium-based alloy, cupronickel (copper-nickel alloy), or the like may be used as the material of the pipe. It is satisfactory that the thermal medium is a medium that can flow through the pipe 20; therefore, not only liquid but also gas may be used.

A method for manufacturing the temperature regulator 100 will be explained below.

First, the pipe 20 is formed with a metal or alloy having corrosion resistance to a thermal medium to be used. The pipe 20 may be formed by, for example, performing a bending process on a welded tube. It is preferable to set the thickness of the pipe 20 in accordance with the hardness of the material or the shape of the cross section in consideration of a subsequent process in which powder is sprayed toward the pipe. For example, if stainless steel is used and the cross section is a circle, it is preferable to set the thickness to about 100 µm or more.

Figure 2:
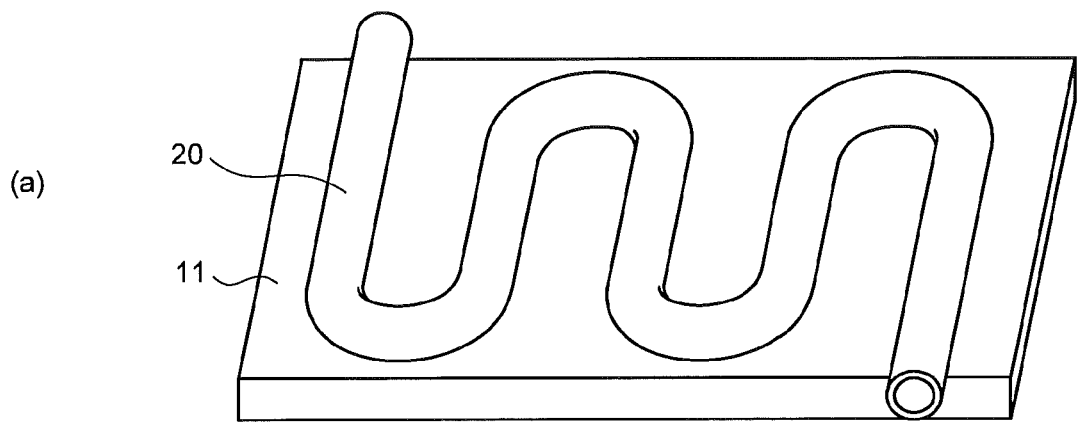
FIG. 2 is a diagram for explaining a method for manufacturing the temperature regulator illustrated in FIG. 1A and FIG. 1B.
Figure 2:
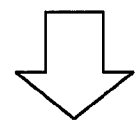
Figure 2:
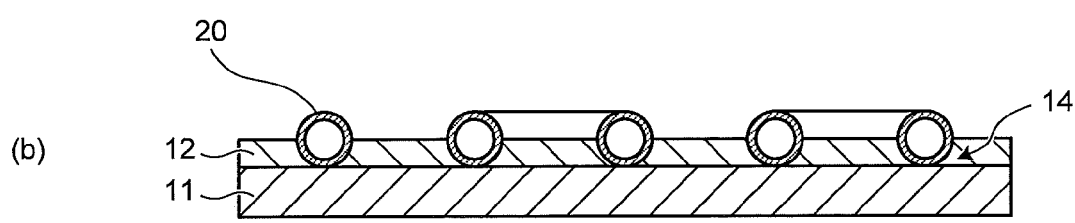
Figure 2:
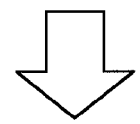
Figure 2:
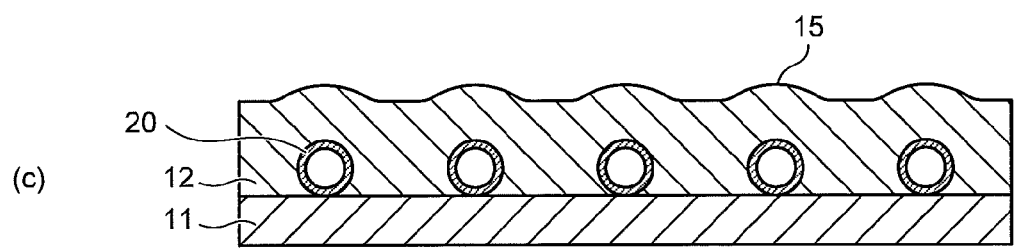

Subsequently, as illustrated in FIG. 2(a), the formed pipe 20 is placed on the base plate 11 cut out in a desired shape. Then, as illustrated in FIG. 2(b), the deposition portion 12 is formed on the base plate by using a coating method based on the cold spray technique.

Figure 3:
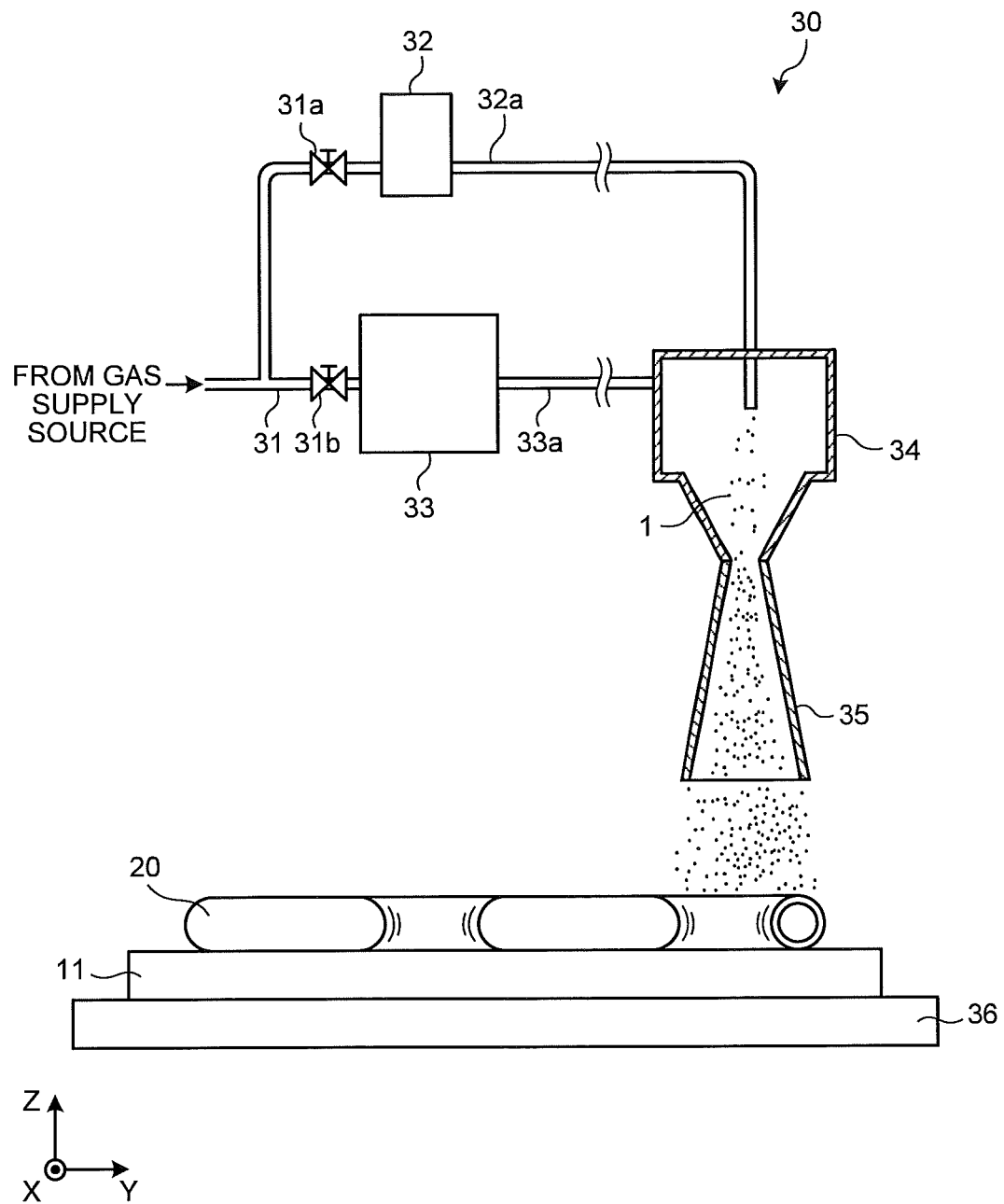
FIG. 3 is a schematic diagram illustrating a structure of a coating equipment using a cold spray technique.

FIG. 3 is a schematic diagram illustrating a structure of a coating equipment using the cold spray technique. A coating equipment 30 includes a gas introduction tube 31 for introducing an inert gas, such as helium (He) or nitrogen ($N_2$), or a gas (working gas), such as air, from a gas supply source; a powder supplying unit 32 that supplies aluminum-based metal powder 1 as a raw material; a heater 33 that heats a gas introduced from the gas introduction tube 31 to a desired temperature; a chamber 34 for mixing the powder 1 and the gas for spraying; a nozzle 35 for spraying the powder 1; and a holder 36 for holding the base plate 11.

The powder supplying unit 32 contains the powder 1, which has an extremely small size (for example, with a particle diameter of about 10 µm to 100 µm) and which is made of an aluminum-based metal. A gas is introduced into the powder supplying unit 32 at a desired flow rate by operating a valve 31a provided on the gas introduction tube 31, so that the powder 1 is supplied to the inside of the chamber 34 together with the gas through a powder supply tube 32a.

The heater 33 heats the introduced gas to, for example, about 50° C. to 700° C. The upper limit of the heating temperature is lower than the melting point of the raw material because the powder 1 is sprayed onto the base plate 11 while the powder 1 remains in a solid phase. More preferably, the upper limit of the temperature is limited to about 60% or less of the melting point in the Celsius temperature scale. This is because the possibility that the powder 1 is oxidized is increased as the heating temperature increases. Therefore, for example, to form a coating with aluminum (the melting point is about 660° C.), it is sufficient to set the heating temperature to be lower than about 660° C., and it is more preferable to set the heating temperature to be about 396° C. or lower.

The gas heated by the heater 33 is introduced into the chamber 34 through a gas duct 33a. The flow rate of the gas introduced into the chamber 34 is adjusted by operating a valve 31b provided on the gas introduction tube 31.

In the chamber 34, a gas-flow from the nozzle 35 to the base plate 11 is formed by the gas introduced from the gas duct 33a. If the powder 1 is supplied from the powder supplying unit 32 to the chamber 34, the powder 1 is accelerated and heated with the aid of the gas-flow and is sprayed onto the base plate 11 and the pipe 20 through the nozzle 35. Due to the impact of the spray, the powder 1 sinks into the surfaces of the base plate 11 and the pipe 20, undergoes plastic deformation due to kinetic energy and thermal energy thereof, and adheres to the surfaces of the base plate 11 and the pipe 20, so that the deposition portion 12 is formed.

The speed to accelerate the powder 1, that is, the flow rate of the gas sprayed from the nozzle 35 is supersonic speed (about 340 m/s or more). For example, it is preferable to set the speed to about 400 m/s or more. It is possible to control the speed by adjusting the flow rate of the gas to be introduced into the chamber 34 by operating the valve 31b. As in the coating equipment 30, if the nozzle 35 whose aperture is extended in a tapered shape from a base end to a distal end is used, the gas-flow formed in the chamber 34 can be reduced temporarily at the inlet port of the nozzle 35 and thereafter accelerated.

As illustrated in FIG. 3, if a coating range (the area of the base plate 11) is greater than the aperture of the nozzle 35, the coating is performed by moving the nozzle 35 in the X-Y direction. Alternatively, it may be possible to fix the position of the nozzle 35 and move the holder 36 side. As illustrated in FIG. 2(b), when the cross-section of the pipe 20 is a circle, to adequately accumulate the powder 1 in a gap 14 between the base plate 11 and the pipe 20, it may be possible to tilt the holder 36 in the X-Z direction or in the Y-Z direction to spray the powder 1 in an oblique direction with respect to the base plate 11.

As illustrated in FIG. 2(c), after the deposition portion 12 with an adequate thickness (for example, with which the pipe 20 can be buried adequately) is formed, a deposition surface 15, a side surface, or the like of the deposition portion 12 is polished to remove a coating or the like attached to an unnecessary portion, to thereby make the surface smooth. Consequently, the manufacturing of the temperature regulator 100 is completed.

The temperature regulator 100 has the following characteristics based on the deposition portion 12 formed as described above.

In the cold spray technique, the powder 1 made of a metal hits and sinks into the surface of a lower layer (the surfaces of the base plate 11 and the pipe 20 or the deposition portion 12 that has been deposited) at high speed, undergoes deformation, and adheres to the lower layer, so that a layer firmly adhered to the lower layer is formed. This can be confirmed by the observation of a phenomenon in which the deposition portion 12 is dug into the pipe 20 at the interface between the deposition portion 12 and the pipe 20 (called as the anchoring effect). Specifically, the deposition portion 12 is tightly bonded to not only the base plate 11 made of a similar metal but also the pipe 20 made of a dissimilar metal without gaps. Therefore, the thermal conductivity can hardly be reduced at the interface between the deposition portion 12 and the pipe 20.

Besides, the pipe 20 is firmly fixed by the deposition portion 12 formed around the pipe 20. Therefore, even when the temperature of the pipe 20 changes due to the thermal medium flowing through the pipe 20, it is possible to prevent the pipe 20 from expanding or contracting. Therefore, it is much less likely that another peeling or crack occurs between the deposition portion 12 and the pipe 20 while the temperature regulator 100 is being used (or before and after the use). As a result, it becomes possible to prevent reduction in the thermal conductivity due to the peeling or the like.

Besides, because the deposition portion 12 is formed by the mechanism as described above, the deposition portion 12 itself has an extremely dense layer with, for example, a density of 95% or more of the density of the bulk material. In addition, in the cold spray technique, because the powder 1 is heated only up to a temperature at which the solid phase can be maintained, the powder 1 can hardly be oxidized. Therefore, the deposition portion 12 can be formed with a desired thickness while maintaining the above density. Consequently, good thermal conductivity of 90% or more of the thermal conductivity of the bulk material is maintained even in the deposition portion 12.

As described above, according to the temperature regulator 100 of the first embodiment, it is possible to prevent reduction in the thermal conductivity at the interface between the pipe 20 and the deposition portion 12 or inside the deposition portion 12. Therefore, it is possible to efficiently and uniformly regulate the temperature of a substrate or the like on the substrate holding surface 10a by using a desired thermal medium and by utilizing good thermal conductivity of an aluminum-based metal.

The temperature regulator 100 may be applied to, for example, a cooling device that cools a substrate in a coating equipment using a CVD (chemical vapor deposition) method. In this case, the temperature regulator 100 is installed in a CVD chamber, and ducts for introducing and discharging a thermal medium are respectively connected to the inlet port 21 and the outlet port 22. Then, the substrate is placed on the substrate holding surface 10a and a cooling water as a thermal medium is introduced from the inlet port 21. Accordingly, the cooling water flows through the flow path 23, absorbs heat transferred from the substrate holding surface 10a, and is discharged via the outlet port 22. Consequently, the substrate on the substrate holding surface 10a is uniformly cooled.

Modifications of the temperature regulator 100 will be explained below. In the temperature regulator 100, it is possible to form a desired flow path by changing the shape (a cross section and a route) of the pipe buried in the plate 10.

Figure 4A:
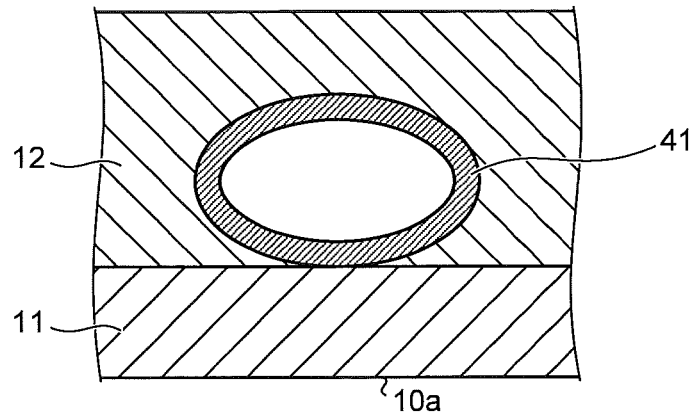
FIG. 4A is a cross-sectional view showing the shape of a pipe according to a first modification.

A pipe 41 illustrated in FIG. 4A has an elliptical cross section, and is arranged such that the long diameter of the ellipse becomes parallel to the substrate holding surface 10a. In this case, it is possible to increase the amount of heat transferred to the substrate holding surface 10a. Therefore, it becomes possible to improve the cooling efficiency or the heating efficiency with respect to a substrate or the like on the substrate holding surface 10a.

Figure 4B:
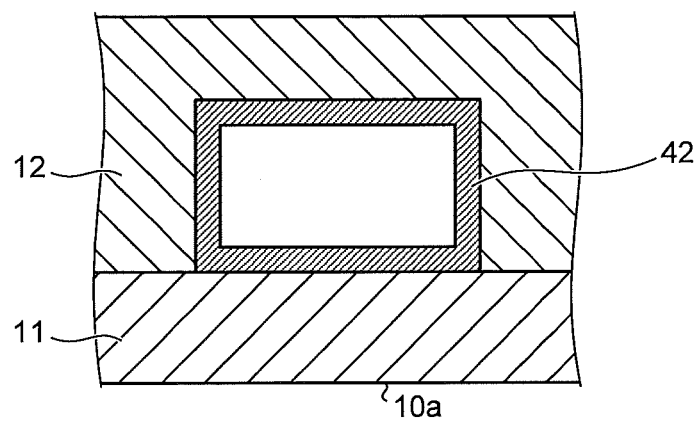
FIG. 4B is a cross-sectional view showing the shape of a pipe according to a second modification.

A pipe 42 illustrated in FIG. 4B has a rectangular cross section, and is arranged such that the long side of the rectangle becomes parallel to the substrate holding surface 10a. Even in this case, it is possible to increase the amount of heat transferred to the substrate holding surface 10a. Therefore, it becomes possible to improve the cooling efficiency or the heating efficiency.

Figure 4C:
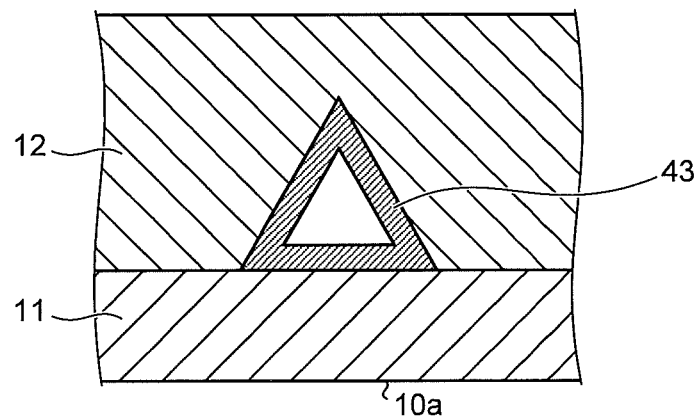
FIG. 4C is a cross-sectional view showing the shape of a pipe according to a third modification.

A pipe 43 illustrated in FIG. 4C has a triangular cross section, and is arranged such that one side among the three sides of the triangle becomes parallel to the substrate holding surface 10a. In this case, it is possible not only to improve the cooling efficiency or the heating efficiency, but also to deposit the powder 1 on the other two sides without greatly tilting the holder 36 of the coating equipment 30 when the deposition portion 12 is formed.

Figure 5:
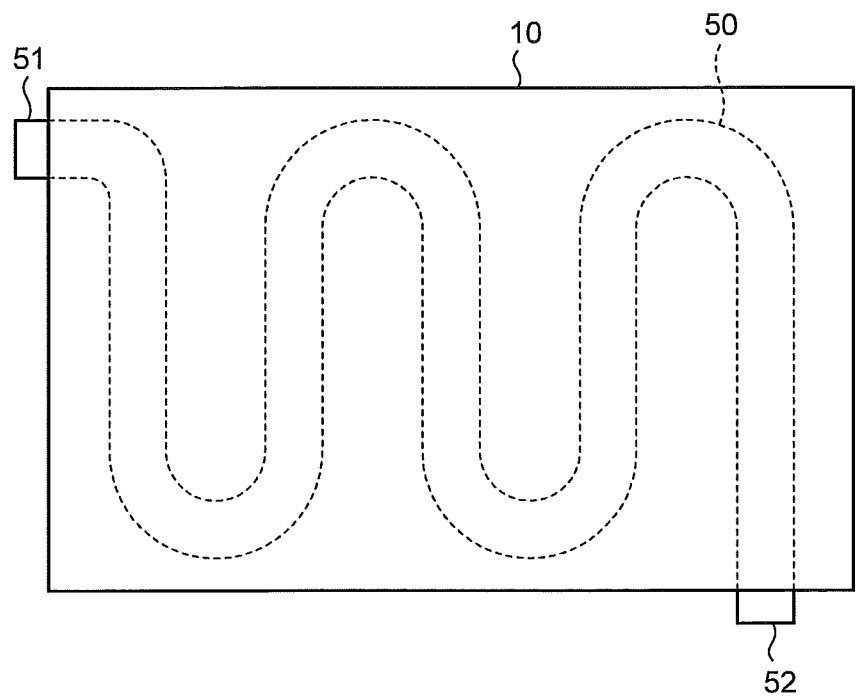
FIG. 5 is a perspective view showing the shape of a pipe according to a fourth modification.

Furthermore, as in a pipe 50 illustrated in FIG. 5, it is possible to arrange an inlet port 51 and an outlet port 52 for a thermal medium at desired positions on the plate 10. Therefore, it becomes possible to increase the flexibility in connecting a duct to the inlet port 51 or the outlet port 52.

(Second Embodiment)

Figure 6A:
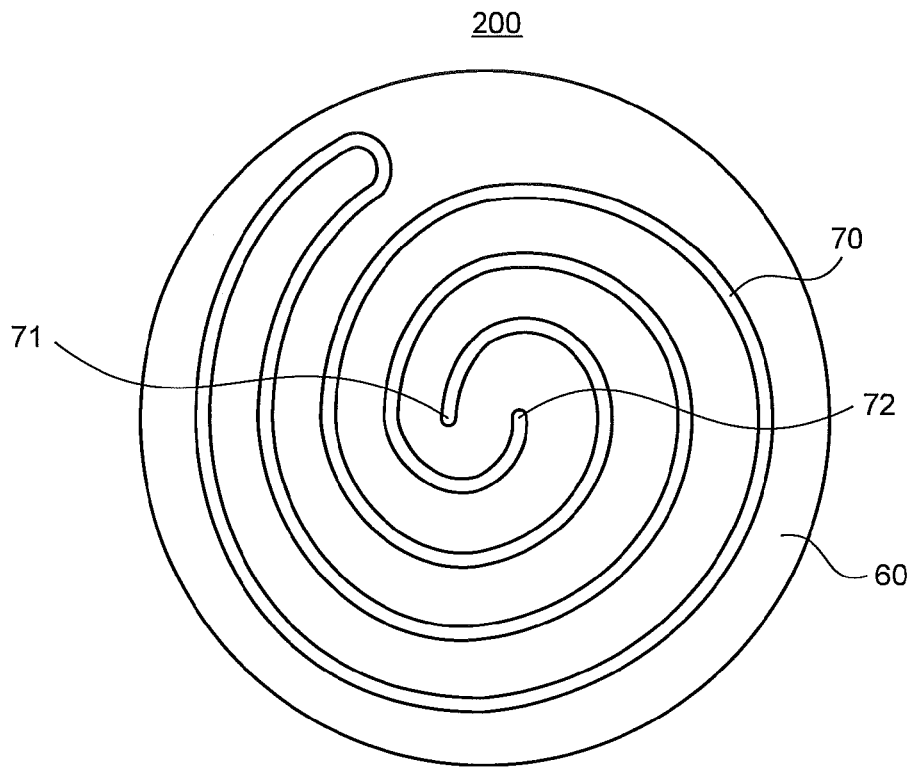
FIG. 6A is a top view illustrating a structure of a temperature regulator according to a second embodiment of the present invention.
Figure 6B:
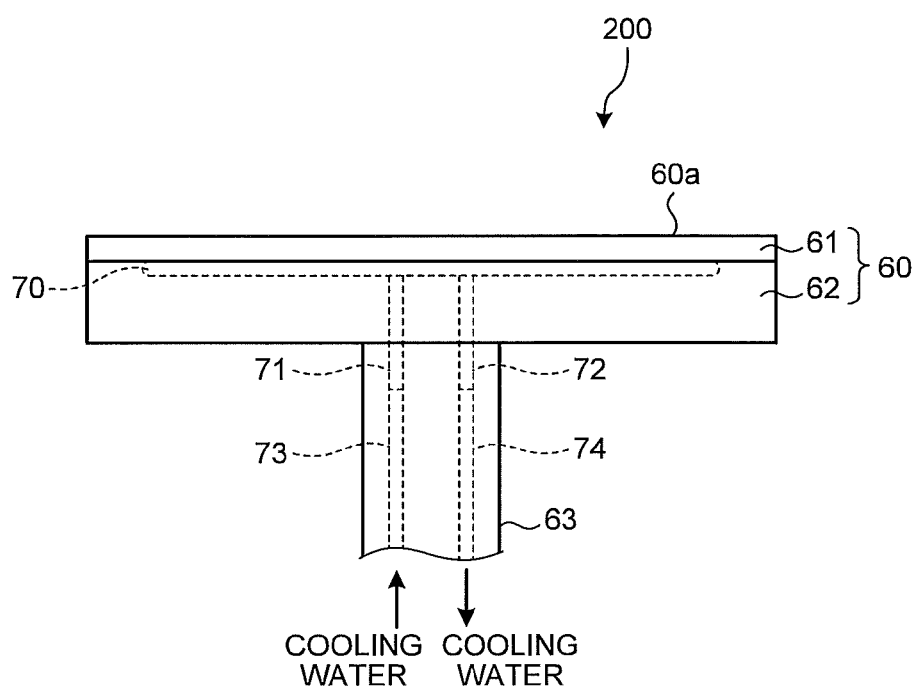
FIG. 6B is a side view of a cooling device to which the temperature regulator illustrated in FIG. 6A is applied.

A temperature regulator according to a second embodiment of the present invention will be explained below. FIG. 6A is a top view illustrating a structure of the temperature regulator according to the second embodiment. FIG. 6B is a side view illustrating a cooling device to which the temperature regulator illustrated in FIG. 6A is applied.

A temperature regulator 200 includes a disk-shaped plate 60 and a pipe 70 buried in the plate 60. The plate 60 and the pipe 70 are made of the same material as explained in the first embodiment.

The plate 60 includes, similarly to the first embodiment, a base plate 61 as a bulk material and a deposition portion 62 formed by a cold spray technique. The principal surface of the plate 60 is a substrate holding surface 60a for placing a substrate or the like to be subjected to temperature regulation.

The pipe 70 has a round-spiral shape. An inlet port 71 and an outlet port 72 for introducing and discharging a thermal medium to and from the pipe 70 are located near the center of the substrate holding surface 60a. By forming the pipe 70 in the shape as described above, it becomes possible to house an introduction duct 73 and a discharge duct 74, which will be described later, in a support pole 63 that supports the plate 60. The cross-sectional shape of the pipe 70 may be changed to a desired shape, similarly to the first embodiment.

The temperature regulator 200 is formed by spraying the powder 1 onto the base plate 61 and the pipe 70 to form the deposition portion 62 by using the coating equipment 30, similarly to the first embodiment. In this case, it is preferable to seal the inlet port 71 and the outlet port 72 to prevent the powder 1 from entering the inlet port 71 and the outlet port 72 of the pipe 70.

To apply the temperature regulator 200 to a cooling device, for example, it is satisfactory to circulate cooling water being a thermal medium inside the pipe 70 by connecting the introduction duct 73 for introducing the cooling water into the pipe 70 to the inlet port 71 and connecting the discharge duct 74 for discharging the cooling water from the pipe 70 to the outlet port 72.

In the first and the second embodiments described above, the surfaces of the plates 10 and 60 on the base plates 11 and 61 side are used as the substrate holding surfaces 10a and 60a. However, the surfaces on the deposition portions 12 and 62 side may be used as the substrate holding surfaces. In this case, the deposition surfaces are smoothed by polishing after the deposition portions 12 and 62 are formed.

In the first and the second embodiments, it may be possible to remove the base plates 11 and 61 by polishing, cutting, or the like after the deposition portions 12 and 62 are formed, and thereafter form aluminum-based metal layers continued from the deposition portions 12 and 62 on the removed surface by using the coating equipment 30. Even in this case, it is possible to deposit aluminum-based metal layers on a region behind the pipes 20 and 70 (for example, the gap 14 in FIG. 2(b)) such that the layers are tightly adhered to the pipes 20 and 70.

REFERENCE SIGNS LIST

1 Powder
10, 60 Plate
10a, 60a Substrate holding surface
11, 61 Base plate
12, 62 Deposition portion
14 Gap
15 Deposition surface
20, 41, 42, 43, 50, 70 Pipe
21, 51, 71 Inlet port
22, 52, 72 Outlet port
23 Flow path
30 Coating equipment
31 Gas introduction tube
31a, 31b Valve
32 Powder supply unit
32a Powder supply tube
33 Heater
33a Gas duct
34a Chamber
35 Nozzle
36 Holder
63 Support pole
73 Introduction duct
74 Discharge duct
100, 200 Temperature regulator

The invention claimed is:

1. A temperature regulator comprising:
a pipe that is made of a metal with corrosion resistance to a predetermined thermal medium, or an alloy with corrosion resistance to the predetermined thermal medium, and serves as a flow path for circulating the thermal medium;
a plate in which the pipe is buried, the plate including:
a deposition portion formed by accelerating powder made of aluminum (Al) or aluminum alloy together with a gas and thereafter spraying the powder remaining in a solid phase toward the pipe so that the powder is deposited on the pipe, and the deposition portion is dug into the pipe at an interface between the deposition portion and the pipe;

a base plate adjacent to the pipe and made of aluminum or aluminum alloy;

a support pole connected to a center of the deposition portion of the plate to support the plate;

an introduction duct housed in the support pole and connected to an inlet port of the pipe; and a discharge duct housed in the support pole and connected to an outlet port of the pipe, wherein the pipe is disposed on a smooth flat surface of the base plate, the base plate defines an upper surface, a distance between the upper surface and pipe is uniform, and a thickness of the deposition portion is thicker than a thickness of the base plate.

2. The temperature regulator according to claim 1, wherein the plate is formed by using a cold spray technique.

3. The temperature regulator according to claim 1, wherein the plate has a substrate holding surface for placing a substrate to be subjected to temperature regulation.

4. The temperature regulator according to claim 1, wherein the pipe is made of any of copper (Cu), copper-based alloy, stainless steel, nickel (Ni), nickel-based alloy, tantalum (Ta), tantalum-based alloy, niobium (Nb), niobium-based alloy, titanium, titanium-based alloy, and copper-nickel alloy.

5. A cooling device comprising:
a temperature regulator comprising:
a pipe that is made of a metal or alloy with corrosion resistance to a predetermined thermal medium and serves as a flow path for circulating the thermal medium;

a plate in which the pipe is buried, the plate including a deposition portion and a base plate, the deposition portion formed by accelerating powder made of aluminum (Al) or aluminum alloy together with a gas and thereafter spraying the powder remaining in a solid phase toward the pipe so that the powder is deposited on the pipe, and the deposition portion is dug into the pipe at an interface between the deposition portion and the pipe, wherein the pipe is disposed on a smooth flat surface of the base plate;

a support pole connected to a center of the deposition portion of the plate to support the plate;

an introduction duct housed in the support pole and connected to an inlet port of the pipe for introducing cooling water into the pipe; and a discharge duct housed in the support pole and connected to an outlet port of the pipe for discharging the cooling water from the pipe, wherein the base plate defines an upper surface, a distance between the upper surface and the pipe is uniform, and a thickness of the deposition portion is thicker than a thickness of the base plate.

* * * * *